(12) United States Patent
Xu

(10) Patent No.: US 9,202,915 B2
(45) Date of Patent: Dec. 1, 2015

(54) METHOD OF FORMING EPI FILM IN SUBSTRATE TRENCH

(71) Applicant: Taiwan Semiconductor Manufacturing Company, Ltd., Hsin-Chu (TW)

(72) Inventor: Jeff J. Xu, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/859,536

(22) Filed: Apr. 9, 2013

(65) Prior Publication Data

US 2013/0228825 A1 Sep. 5, 2013

Related U.S. Application Data

(63) Continuation of application No. 12/784,207, filed on May 20, 2010, now Pat. No. 8,415,718.

(60) Provisional application No. 61/256,431, filed on Oct. 30, 2009.

(51) Int. Cl.
| | |
|---|---|
| *H01L 29/78* | (2006.01) |
| *H01L 21/02* | (2006.01) |
| *H01L 21/3065* | (2006.01) |
| *H01L 21/8238* | (2006.01) |
| *H01L 21/84* | (2006.01) |
| *H01L 29/66* | (2006.01) |

(52) U.S. Cl.
CPC ...... *H01L 29/7848* (2013.01); *H01L 21/02381* (2013.01); *H01L 21/02433* (2013.01); *H01L 21/02521* (2013.01); *H01L 21/02532* (2013.01); *H01L 21/02639* (2013.01); *H01L 21/3065* (2013.01); *H01L 21/823807* (2013.01); *H01L 21/823814* (2013.01); *H01L 21/823821* (2013.01); *H01L 29/66636* (2013.01); *H01L 29/66795* (2013.01); *H01L 21/84* (2013.01); *H01L 21/845* (2013.01); *H01L 29/66628* (2013.01)

(58) Field of Classification Search
CPC ................................................. H01L 21/02381
USPC ......................................................... 257/255
See application file for complete search history.

(56) References Cited

U.S. PATENT DOCUMENTS

| | | | |
|---|---|---|---|
| 6,495,883 B2 | 12/2002 | Shibata et al. | |
| 6,706,571 B1 | 3/2004 | Yu et al. | |
| 6,858,478 B2 | 2/2005 | Chau et al. | |
| 7,056,781 B2 | 6/2006 | Yoon et al. | |
| 7,190,050 B2 | 3/2007 | King et al. | |
| 7,247,887 B2 | 7/2007 | King et al. | |
| 7,265,008 B2 | 9/2007 | King et al. | |
| 7,494,884 B2 | 2/2009 | Lin et al. | |

(Continued)

*Primary Examiner* — Yu-Hsi D Sun
*Assistant Examiner* — Ankush Singal
(74) *Attorney, Agent, or Firm* — Haynes and Boone, LLP

(57) ABSTRACT

The present disclosure provides a method of fabricating a semiconductor device that includes providing a semiconductor substrate, forming a trench in the substrate, where a bottom surface of the trench has a first crystal plane orientation and a side surface of the trench has a second crystal plane orientation, and epitaxially (epi) growing a semiconductor material in the trench. The epi process utilizes an etch component. A first growth rate on the first crystal plane orientation is different from a second growth rate on the second crystal plane orientation.

11 Claims, 15 Drawing Sheets

(56) References Cited

U.S. PATENT DOCUMENTS

| | | |
|---|---|---|
| 7,508,031 B2 | 3/2009 | Liu et al. |
| 7,528,465 B2 | 5/2009 | King et al. |
| 7,534,689 B2 | 5/2009 | Pal et al. |
| 7,573,104 B2 | 8/2009 | Chidambarrao |
| 7,605,449 B2 | 10/2009 | Liu et al. |
| 7,696,569 B2 | 4/2010 | Fujimoto et al. |
| 7,755,140 B2 | 7/2010 | Pae et al. |
| 7,759,199 B2 | 7/2010 | Thomas |
| 7,799,592 B2 | 9/2010 | Lochtefeld |
| 7,807,523 B2 | 10/2010 | Liu et al. |
| 7,862,962 B2 | 1/2011 | Shieh et al. |
| 7,898,037 B2 | 3/2011 | Chuang et al. |
| 7,906,084 B2 | 3/2011 | Mokari et al. |
| 7,906,809 B2 | 3/2011 | Aiso |
| 7,939,862 B2 | 5/2011 | Moroz et al. |
| 7,943,986 B2 | 5/2011 | Yang et al. |
| 7,960,232 B2 | 6/2011 | King et al. |
| 7,977,706 B2 | 7/2011 | Lochtefeld |
| 7,989,355 B2 | 8/2011 | Shieh et al. |
| 8,053,299 B2 | 11/2011 | Xu |
| 8,153,493 B2 | 4/2012 | Lee |
| 8,212,295 B2 | 7/2012 | Liaw |
| 8,278,173 B2 | 10/2012 | Lim et al. |
| 8,283,231 B2 | 10/2012 | Merelle et al. |
| 8,286,114 B2 | 10/2012 | Chuang et al. |
| 8,310,013 B2 | 11/2012 | Lin et al. |
| 8,338,305 B2 | 12/2012 | Chen et al. |
| 8,357,569 B2 | 1/2013 | Pawlak |
| 8,367,498 B2 | 2/2013 | Chang et al. |
| 8,373,229 B2 | 2/2013 | Chen et al. |
| 8,395,230 B2 | 3/2013 | Hozumi et al. |
| 8,399,931 B2 | 3/2013 | Liaw et al. |
| 8,445,340 B2 | 5/2013 | Lee et al. |
| 8,466,490 B2 | 6/2013 | Liu et al. |
| 8,486,769 B2 | 7/2013 | Wang et al. |
| 8,525,267 B2 | 9/2013 | Wang et al. |
| 8,530,355 B2 | 9/2013 | Yan et al. |
| 8,609,495 B2 | 12/2013 | Gan et al. |
| 8,621,398 B2 | 12/2013 | Shen et al. |
| 8,633,076 B2 | 1/2014 | Wang et al. |
| 8,675,397 B2 | 3/2014 | Liaw |
| 8,729,627 B2 | 5/2014 | Cheng et al. |
| 8,786,057 B2 | 7/2014 | King et al. |
| 8,796,759 B2 | 8/2014 | Perng et al. |
| 8,881,084 B2 | 11/2014 | Shen et al. |
| 8,883,597 B2 | 11/2014 | Chang et al. |
| 2004/0014276 A1* | 1/2004 | Murthy et al. ............. 438/231 |
| 2006/0108635 A1 | 5/2006 | Bhalla et al. |
| 2006/0131606 A1* | 6/2006 | Cheng ........................ 257/190 |
| 2006/0228872 A1 | 10/2006 | Nguyen et al. |
| 2007/0249114 A1* | 10/2007 | Chen et al. ................. 438/229 |
| 2007/0249168 A1* | 10/2007 | Rotondaro et al. ......... 438/700 |
| 2008/0303090 A1* | 12/2008 | Ieong et al. ................. 257/351 |
| 2009/0032887 A1 | 2/2009 | Jang et al. |
| 2009/0039361 A1 | 2/2009 | Li et al. |
| 2011/0147846 A1 | 6/2011 | Su et al. |
| 2011/0317485 A1 | 12/2011 | Liaw |
| 2012/0009690 A1 | 1/2012 | Wann et al. |
| 2012/0018848 A1 | 1/2012 | Huang et al. |
| 2012/0104472 A1 | 5/2012 | Xu et al. |

\* cited by examiner

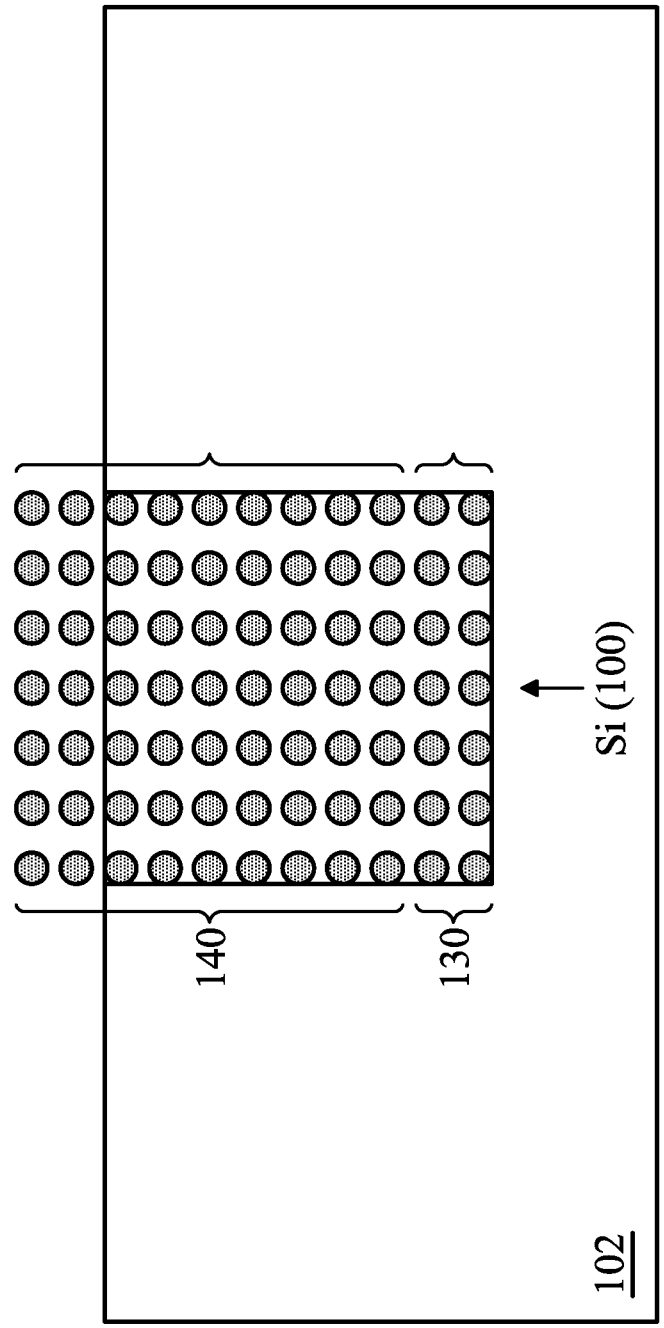

METHOD OF FORMING EPI FILM IN SUBSTRATE TRENCH

PRIORITY DATA

This application is a continuation of U.S. Ser. No. 12/784,207 filed on May 20, 2010, entitled, "Method of Forming epi Film In Substrate Trench," which claims priority to Provisional Application Ser. No. 61/256,431 filed on Oct. 30, 2009, the entire disclosure of which is incorporated herein by reference.

BACKGROUND

When a semiconductor device such as a metal-oxide-semiconductor field-effect transistors (MOSFETs) is scaled down through various technology nodes, high-k dielectric material and metal gate are adopted to form a gate stack. Strained structures utilizing epitaxy silicon germanium (SiGe) and silicon carbon (SiC) films may be used to enhance carrier mobility. In addition, channel-last integration schemes may also become a requirement for low melting temperature III-V high mobility channel materials such as InAs and InSb to avoid impact from high thermal budget associated with source/drain formation. However, current techniques to form these strained structures and channel-last transistors have not been satisfactory in all respects. For example, Si N-channel strain is limited to problematic SiC films and no solution for Ge P-channel strain has been found. It is even more challenging to realize epitaxy films for channel-last transistors with conventional epitaxial growth techniques.

SUMMARY

One of the broader forms of an embodiment of the present invention involves a method of fabricating a semiconductor device. The method includes providing a semiconductor substrate; forming a trench in the substrate, wherein a bottom surface of the trench has a first crystal plane orientation and a side surface of the trench has a second crystal plane orientation; and epitaxially (epi) growing a semiconductor material in the trench. The epi process utilizes an etch component. A first growth rate on the first crystal plane orientation is different from a second growth rate on the second crystal plane orientation.

Another one of the broader forms of an embodiment of the present invention involves a semiconductor device. The semiconductor device includes a semiconductor substrate and a transistor. The transistor includes a gate structure disposed over the substrate and strained source and drain features having a strained film structure.

Yet another one of the broader forms of an embodiment of the present invention involves a method of fabricating a semiconductor device. The method includes providing a semiconductor substrate; forming a trench in the substrate, wherein a first surface of the trench has a first crystal plane orientation and a second surface of the trench has a second crystal plane orientation; and performing an epitaxial (epi) growth process to grow an epi film in the trench, the epi growth process incorporating an etch component. A first growth rate on the first crystal plane orientation is different from a second growth rate on the second crystal plane orientation such that the etch component prohibits growth on one of the first and second crystal plane orientations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2A-2C are cross-sectional views of an epi film being formed in a substrate trench according to the method of FIG. 1;

DETAILED DESCRIPTION

Figure 1:
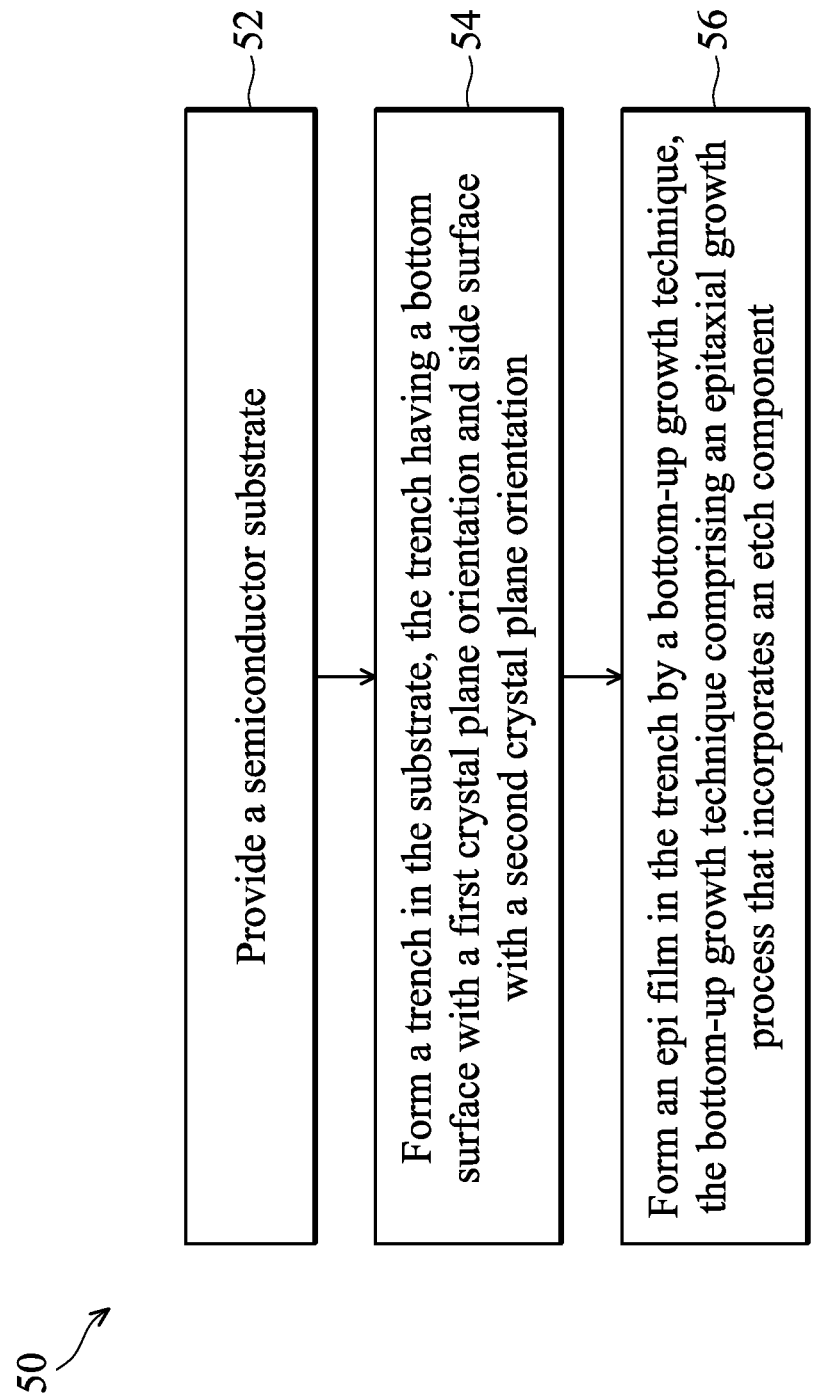
FIG. 1 is a flow chart of a method of forming an epi film in a substrate trench utilizing a bottom-up growth technique according to various aspect of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Referring to FIG. 1, illustrated is a flow chart of a method 50 of forming an epi film in a substrate trench using a bottom-up growth technique according to an embodiment of the present disclosure. The method 50 begins with block 52 in which a semiconductor substrate is provided. The method 50 continues with block 54 in which a trench is formed in the substrate. The trench includes a bottom surface with a first crystal plane orientation and side surface with a second crystal plane orientation. The method 50 continues with block 56 in which an epi film is formed in the trench by a bottom-up growth technique. The bottom-up growth technique comprises an epitaxial growth process that incorporates an etch component. A growth rate on the first crystal plane orientation is different from a growth rate on the second crystal plane orientation.

Figure 2A:
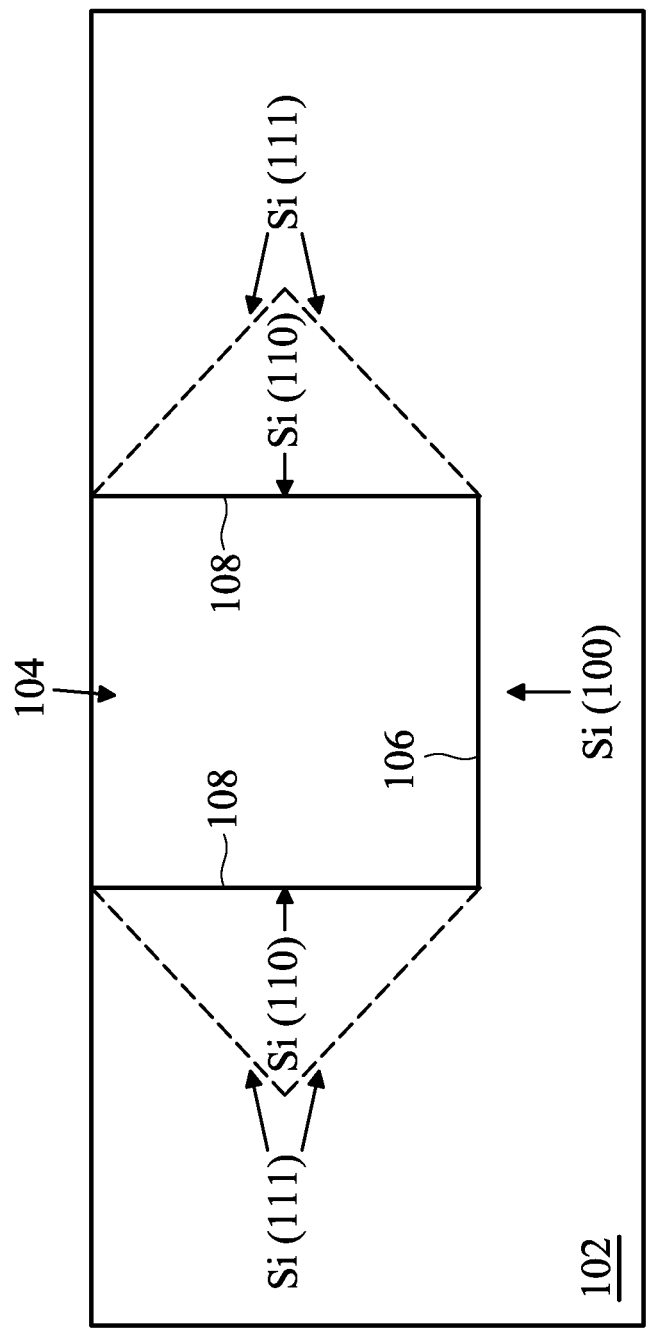
Figure 2B:
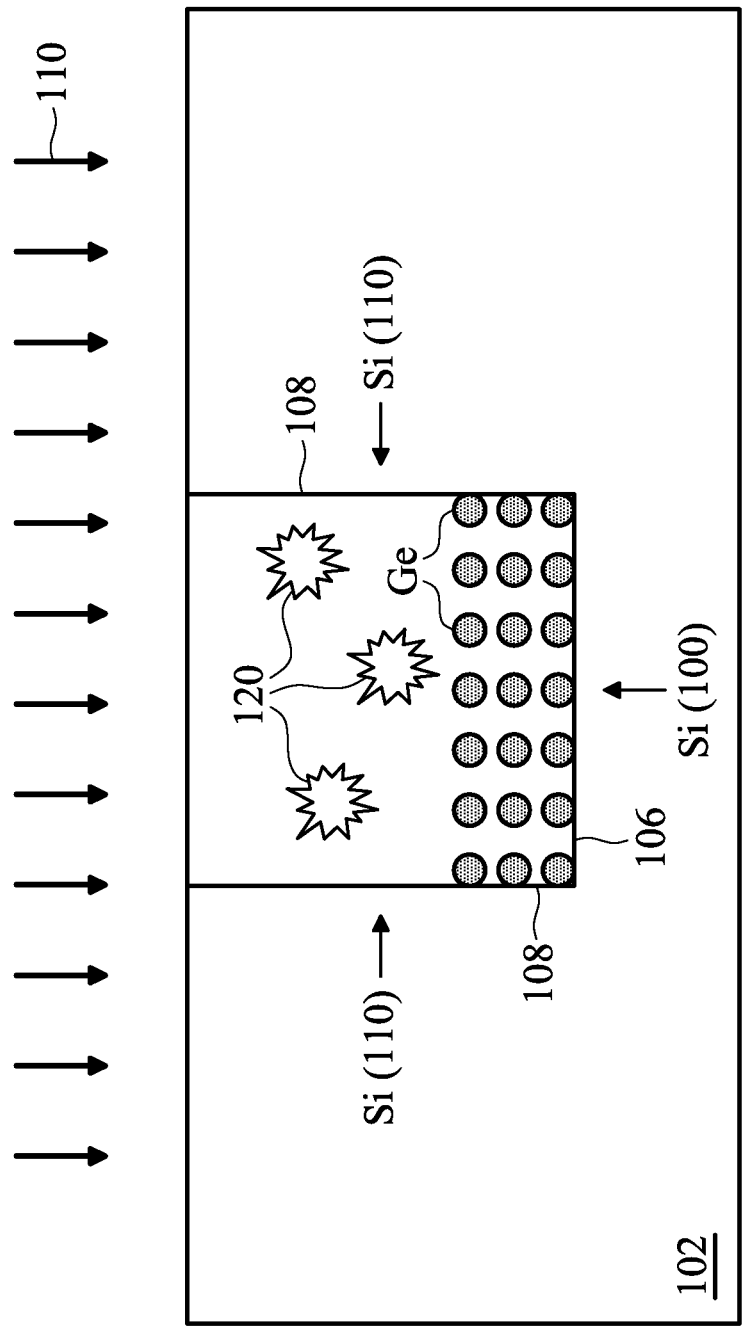

Referring to FIGS. 2A-2C, illustrated is a crystal structure being formed according to an embodiment of the method 50 of FIG. 1. In an embodiment, a crystal is grown in a substrate such as a silicon (Si) trench. The crystal may be the same or different from the substrate. In various embodiments, the crystal includes Si, SiGe, Ge, SiC, or other suitable semiconductor materials. In FIG. 2A, a semiconductor substrate 102 is provided which includes a silicon (Si) substrate or other semiconductor substrate, such as Ge or III-V compound semiconductor, in a crystalline structure. In another embodiment, the semiconductor substrate 102 may include an epitaxial (epi) layer. A trench 104 is formed in the substrate 102 by an etching or other suitable process. The trench 104 includes a bottom surface 106 that has a crystal plane orientation, e.g., [100], and side surfaces 108 that have a crystal plane orientation, e.g., [110] or [111]. It should be noted that specified crystal plane orientations are mere examples and that other crystal plane orientations may be utilized as will be apparent in light of the discussion that follows.

In FIG. 2B, a bottom-up growth process 110 is performed to grow an epitaxial film (epi film) in the substrate trench 104. Accordingly, the bottom-up growth process utilizes a precursor or precursors. In the case of Ge epi growth, GeH4 may be used having a flow rate ranging from about 5 to 10 sccm with an etch component 120 such as HCl having a flow rate ranging from about 10 to about 30 sccm. In some embodiments, the etch component 120 may includes other Cl, or Br containing gases such as Cl2, BCl3, BiCl3, and BiBr3. In other embodiments, F containing gases such as NF3 and HF may be used, however, some of the STI oxide and other dielectric (SiO2, SiN) hard-mask may be etched by such F based gases. The bottom up growth process 110 implements a temperature suitable for the epi film growth. For Ge epi growth, a temperature ranging from about 450 to about 550° C. and a total pressure ranging from about 20 to 760 Torr could be used. It should be noted that the etch component such as HCl is sensitive to the temperature and thus the temperature can be tuned to achieved the desired etching effect as discussed below. Further, it is understood that other ranges may be used in applications with different types of crystal materials.

The growth rate on the bottom surface 106 is different from the growth rate on the side surfaces 108 due to the different crystal plane orientations of the substrate 102 such as silicon. In an embodiment, it has been observed that Ge growth on the [100] crystal plane (bottom surface 106) is about three times (3×) faster than the Ge growth on the [110] crystal plane (side surfaces 108). Further, the Ge growth rate on silicon [111] crystal plane is expected to be slower than on silicon [110] crystal plane. Accordingly, the bottom-up growth process 110 incorporates the etch component 120 to promote bottom-up Ge growth by preventing Ge from growing on the side surfaces 108 of the silicon trench 104. For example, Ge is grown from the bottom surface 106 of the silicon trench 104 at a higher rate than that of Ge grown from the side surfaces 108 of the silicon trench 104. The etch component 120 removes the Ge disposed on the side surfaces 108 as well as some Ge disposed from the bottom surface 106. However, since the Ge growth rate from the bottom surface 106 is greater than from the side surface 106, the net effect is that Ge will substantially grow from the bottom-up.

In FIG. 2C, the bottom-up growth process 110 continues until a desired thickness is achieved. It is noted that there will be some dislocation defects at the bottom portion if lattice mismatch is substantially large between substrate and epi film. As such, there will be a portion of the epi film crystal at the bottom portion 130 of the trench that includes dislocation defects due to mismatch between the substrate lattice and the epi film lattice. Ge epi growth in a Si trench is a typical example. However, in some other embodiments, there will not be any dislocation defects at the bottom portion when the lattice mismatch is small between substrate and epi film, e.g., GaAs growth in Ge trench.

Further, there will be an upper portion 140 above the bottom portion 130 where the large lattice mismatch epi layer like Ge crystal is substantially defect free. Moreover, it is noted that dislocation defects are not present on the side surfaces 108 since the large lattice mismatch epi film growth from the side surfaces was prohibited by the etch component 120. Thus, the bottom-up growth process 110 traps dislocation defects, if any, at the bottom portion 130 of the trench, and forms a substantially defect-free pure single crystal, e.g., Ge structure, at the upper portion 140 of the substrate, e.g., Si trench. Accordingly, the defect-free epi film structure like Ge crystal could be used either as a compressive or tensile strain stressor into the substrate 102 due to having a large or small lattice constant than the substrate or a transistor channel with or without a desired compressive or tensile strain.

Although the discussion above uses pure Ge crystal as an example, the bottom-up growth technique may be implemented to grow other types of crystal structures such as silicon carbide (SiC) for NMOS device stressor, III-V compound semiconductors such as GaAs and InSb can be grown in Si or Ge trench as channel materials. For SiC growth, the etchant component may be the same one used for Ge growth. For III-V compound semiconductors, the etch component may include Cl or Br containing gases.

Further, it is noted that other process parameters may be tuned to modulate the growth rate on different crystal planes. For example, temperature, pressure, etching gas flow, carrying gas flow, and deposition gas flow, and combinations thereof may be used to modulate the growth rate. Moreover, the bottom-up growth technique is fully compatible and can easily be integrated with current fabrication technologies such as CMOS technology processing.

Figure 3:
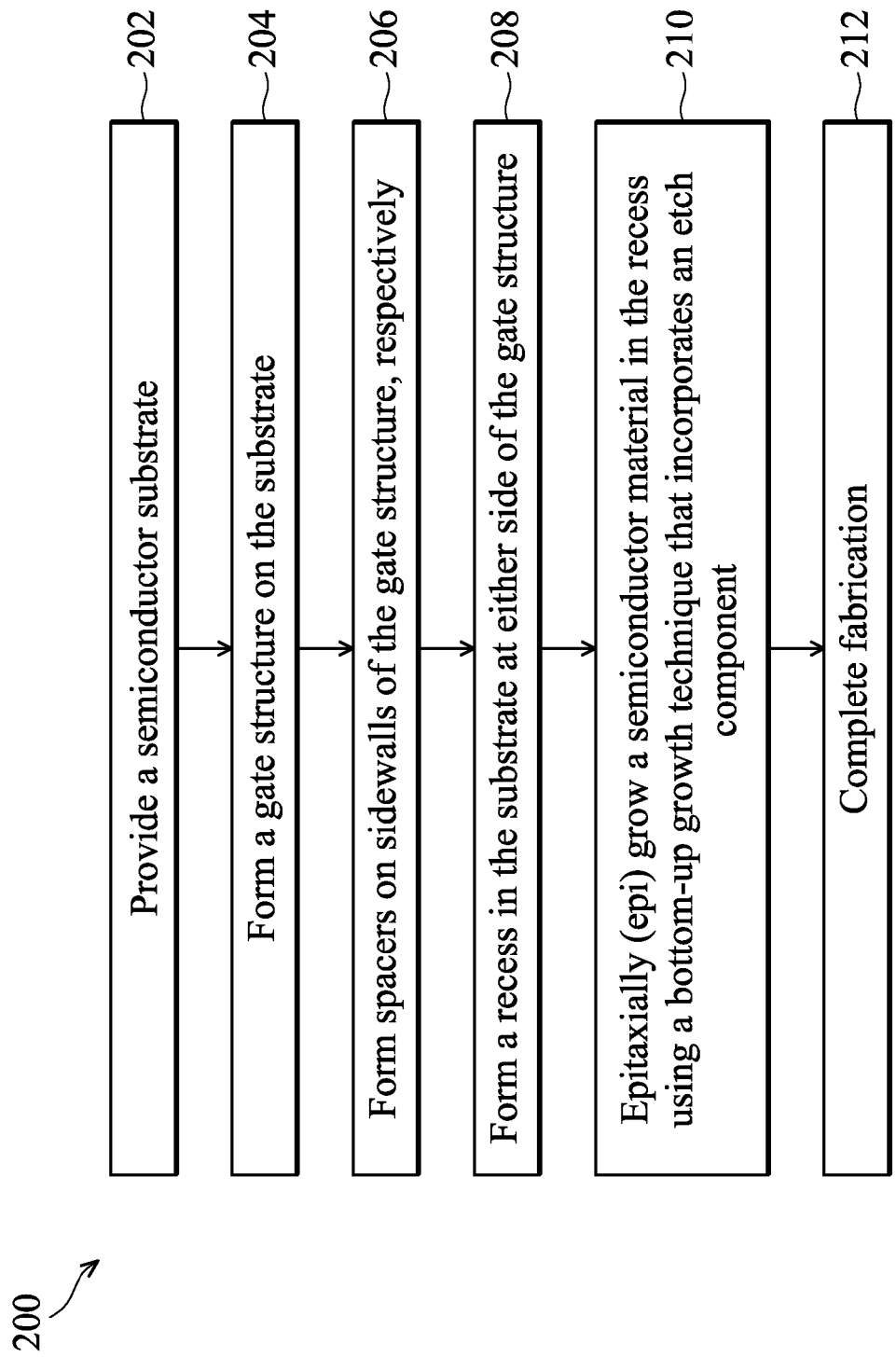
FIG. 3 is a flow chart of a method of fabricating a semiconductor device with strained structures according to various aspects of the present disclosure.

Referring to FIG. 3, illustrated is a flow chart of a method 200 of fabricating a semiconductor device according to various aspects of the present disclosure. The method 200 begins with block 202 in which a semiconductor substrate is provided. The method 200 continues with block 204 in which a gate structure is formed on the substrate. The method 200 continues with block 206 in spacers are formed on sidewalls of the gate structure, respectively. The method continues with block 208 in which a recess is formed in the substrate at either side of the gate structure. The method 200 continues with block 210 in which a semiconductor material is epitaxially grown to fill the recess using bottom-up growth that incorporates an etch component. The method 200 continues with block 212 in which fabrication of the semiconductor device is completed. The discussion that follows illustrates various embodiments of a semiconductor device that can be fabricated according to the method 200 of FIG. 3.

Figure 4A:
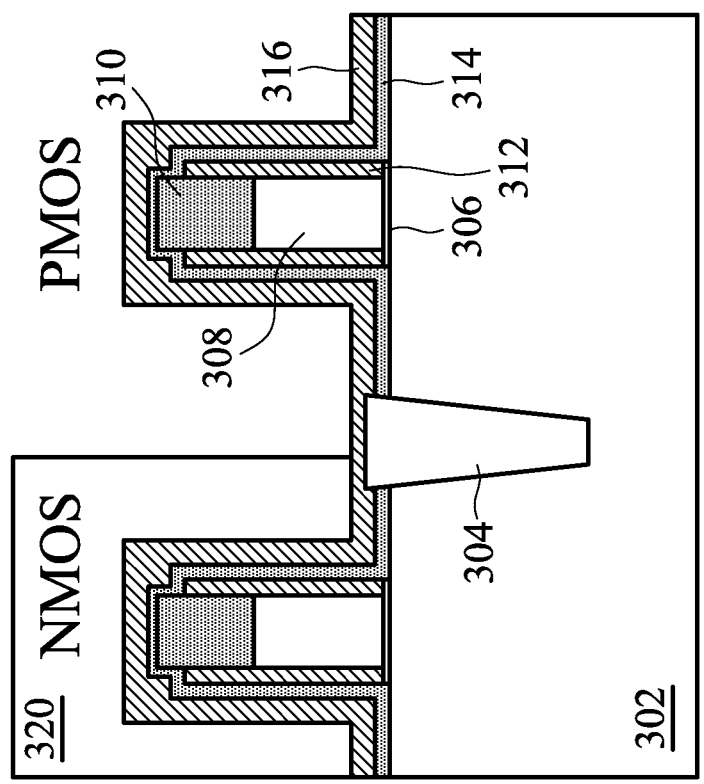
FIGS. 4A-4F are cross-sectional views of an embodiment of a semiconductor device at various stages of fabrication according to the method of FIG. 3.

Referring to FIGS. 4A-4F, illustrated is an embodiment of a semiconductor device 300 at various stages of fabrication according to the method 200 of FIG. 3. It is understood that FIGS. 4A-4F have been simplified for the sake of clarity to better understand the inventive concepts of the present disclosure. In FIG. 4A, the semiconductor device 300 includes a substrate 302. The substrate 302 includes a silicon substrate. In another embodiment, the semiconductor substrate 302 may include an epitaxial layer. For example, the substrate 302 may have an epitaxial layer overlying a bulk semiconductor. The substrate 302 further includes doped regions such as p-wells and n-wells. Furthermore, the substrate 302 may include a semiconductor-on-insulator (SOI) structure such as a buried dielectric layer. Alternatively, the substrate 302 may include a buried dielectric layer such as a buried oxide (BOX) layer, such as that formed by a method referred to as separation by implantation of oxygen (SIMOX) technology, wafer bonding, selective epitaxial growth (SEG), or other proper method. The semiconductor device 300 includes active regions defined in the substrate 302.

Various shallow trench isolation (STI) structures 304 are formed in the semiconductor substrate for isolating the various active regions. The formation of STI may include etching a trench in a substrate and filling the trench by insulator materials such as silicon oxide, silicon nitride, or silicon oxynitride. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure.

One or more operational devices are formed in the active regions. The operational devices include n-type and p-type metal-oxide-semiconductor field-effect transistors (NMOS and PMOS devices). The operational devices are configured as an array of NMOS devices and an array of PMOS devices. The NMOS and PMOS devices may be fabricated by CMOS technology processing. Accordingly, it is understood that additional processes may be provided before, during, and after the method 200 of FIG. 3, and that some other processes may only be briefly described herein. Each NMOS and PMOS device includes a gate structure formed on the semiconductor substrate 302. The gate structure includes a gate dielectric 306 and a gate electrode 308. The gate dielectric 306 may include silicon oxide, silicon nitride, high-k dielectric, or other suitable material. The high-k dielectric layer may include a binary or ternary high-k film such as HfOx. Alternatively, the high-k dielectric layer 306 may optionally include other high-k dielectrics such as LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfSiO, (Ba, Sr)TiO3 (BST), Al2O3, Si3N4, oxynitrides, or other suitable materials. The gate dielectric is formed by a suitable process such as an atomic layer deposition (ALD), chemical vapor deposition (CVD), physical vapor deposition (PVD), thermal oxidation, UV-ozone oxidation, or combinations thereof.

The gate electrode 308 may include polysilicon (or poly). For example, silane ($SiH_4$) may be used as a chemical gas in a CVD process to form the poly. The poly layer may include a thickness ranging from about 400 to about 800 Angstrom (Å). The gate structure may further include a hard mask layer 310 formed on the gate electrode 308. The hard mask layer 310 include silicon oxide. Alternatively, the hard mask layer 310 may optionally silicon nitride, silicon oxynitride, and/or other suitable dielectric materials, and may be formed using a method such as CVD or PVD. The hard mask layer 310 may include a thickness ranging from about 100 to about 400 Angstrom (Å).

The semiconductor device 300 includes an offset spacer 312 formed on each sidewall of the gate structures. The offset spacer 312 may include silicon oxide and silicon nitride. The offset spacer 312 may be formed by CVD, PVD, ALD, plasma enhanced CVD (PECVD), or other suitable technique. An ion implantation process may be performed to form lightly doped source/drain regions (LDD) in the substrate 302 (not shown). The ion implantation process may utilize p-type dopants (e.g., B or In) for the PMOS device and n-type dopants (P or As) for the NMOS device.

The semiconductor device 300 further includes an oxide layer 314 formed over the substrate 302 and the gate structures. The oxide layer may be formed by CVD, PVD, ALD, or other suitable technique. The oxide layer 314 includes a thickness ranging from about 2 to about 4 nm. The semiconductor device 300 further includes a nitride layer 316 formed over the oxide layer 314. The nitride layer 316 may be formed of silicon nitride. The nitride layer 316 may be formed by CVD, PVD, ALD, or other suitable technique. The nitride layer 316 includes a thickness ranging from about 10 to about 15 nm. The oxide layer 314 and nitride layer 316 may be etched to form spacers that are used in the formation of the strained source and drain features as discussed below. Accordingly, the thicknesses of the oxide layer 314 and the nitride layer 316 may determine how far the strained source and drain features will be spaced from a channel region of the PMOS device.

A patterned photoresist layer 320 is formed to protect the NMOS devices. The patterned photoresist layer 320 may be formed by a photolithography process. An exemplary photolithography process may include processing steps of photoresist coating, soft baking, mask aligning, exposing, post-exposure baking, developing photoresist and hard baking. The photolithography exposing process may also be implemented or replaced by other proper techniques such as maskless photolithography, electron-beam writing, ion-beam writing, and molecular imprint.

Figure 4B:
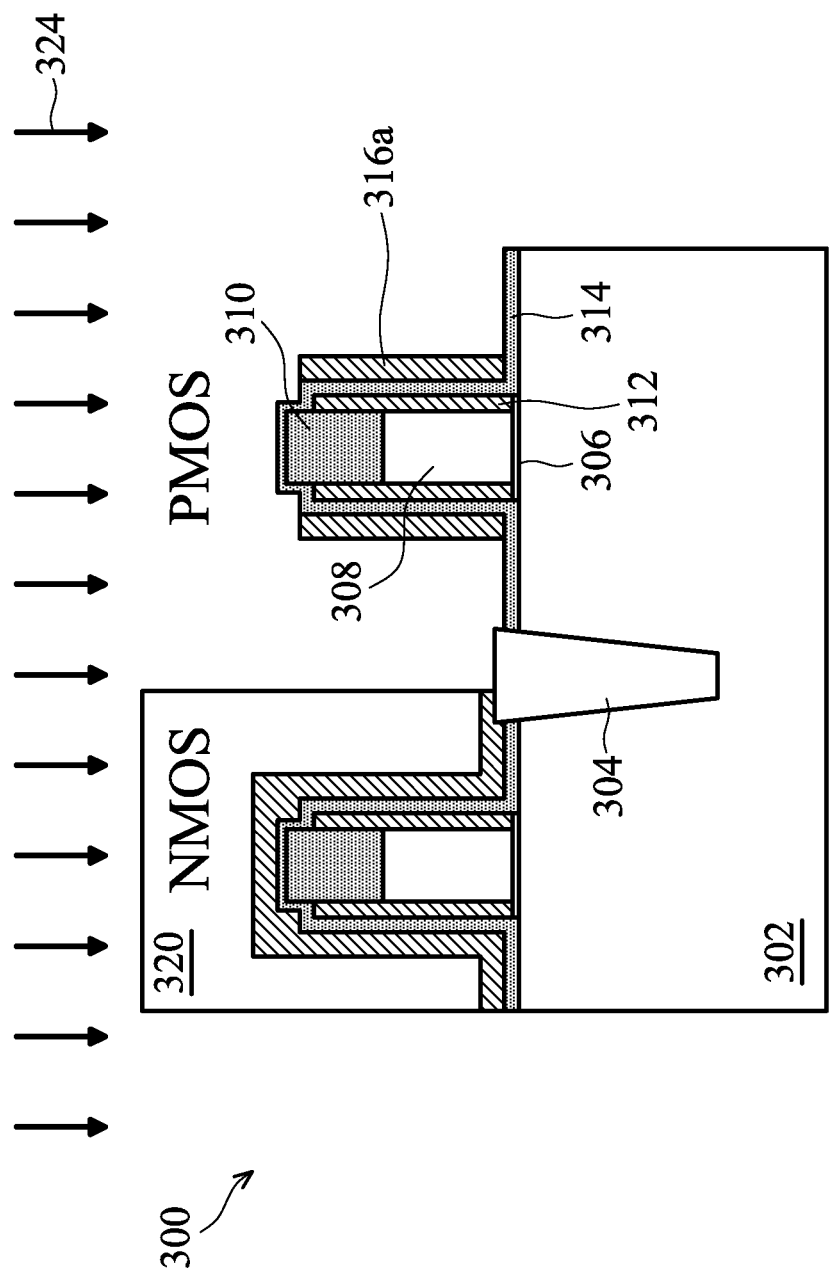

In FIG. 4B, an etching process 324 is performed to remove portions of the nitride layer 316 directly overlying the substrate 302. In the present embodiment, the etching process 224 includes a dry etching process that utilizes a gas combination of $CH_xF_y/O_2$ or $SF_6/CH_xF_y/He$ (where x=1 to 3 and y=4−x) or other suitable gas combination. The dry etching provides directional etching (e.g., anisotropic etching) such that some portions of the nitride layer 316a remain over the sidewalls of the gate structure following the etching process 324.

Figure 4C:
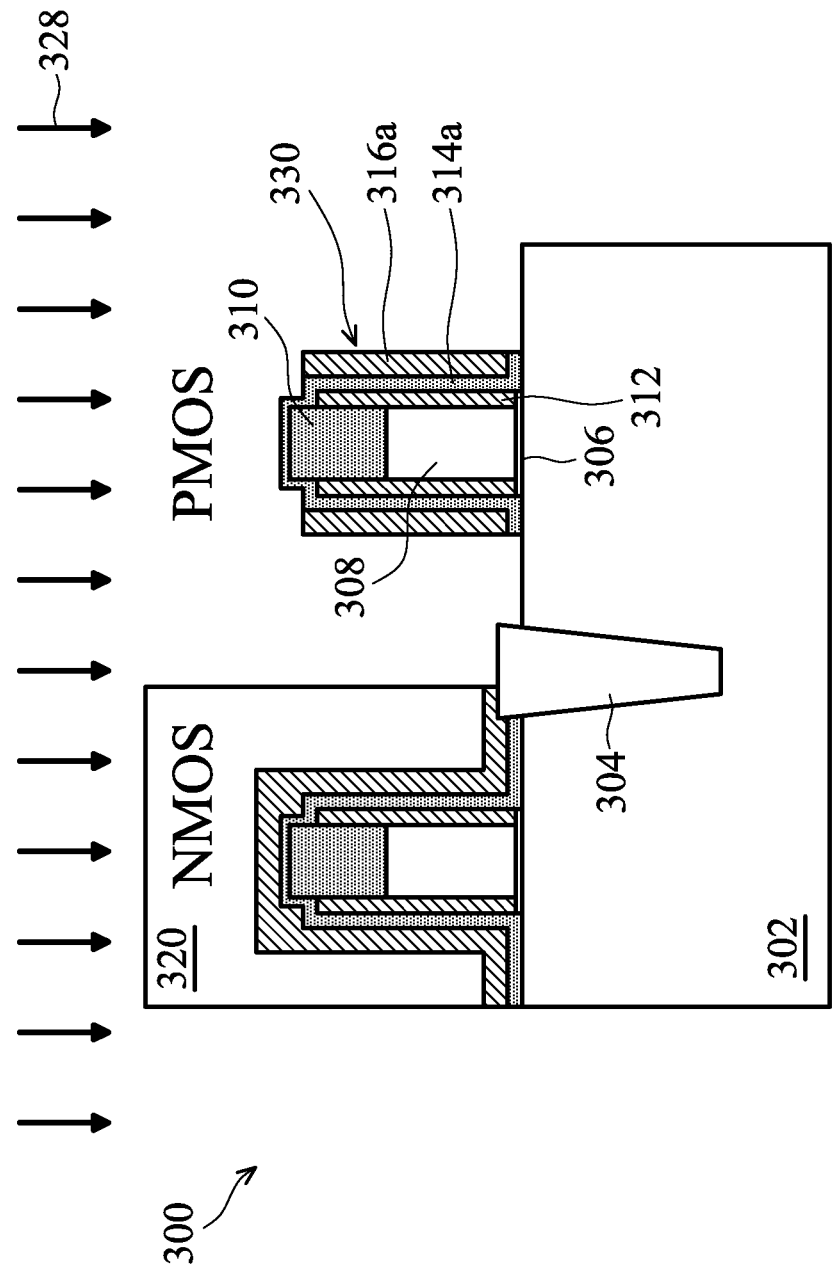

In FIG. 4C, an etching process 328 is performed to break through the oxide 314 directly overlying the substrate 302. The etching process 328 includes a dry etching process that utilizes a gas combination of $CF_4/Cl_2/HBr/He$ or other suitable gas combination. Therefore, following the etching process 328, a portion of the oxide layer 314a and the nitride layer 316a remain of the sidewalls of the gate structure of the PMOS device thereby forming spacers 330.

Figure 4D:
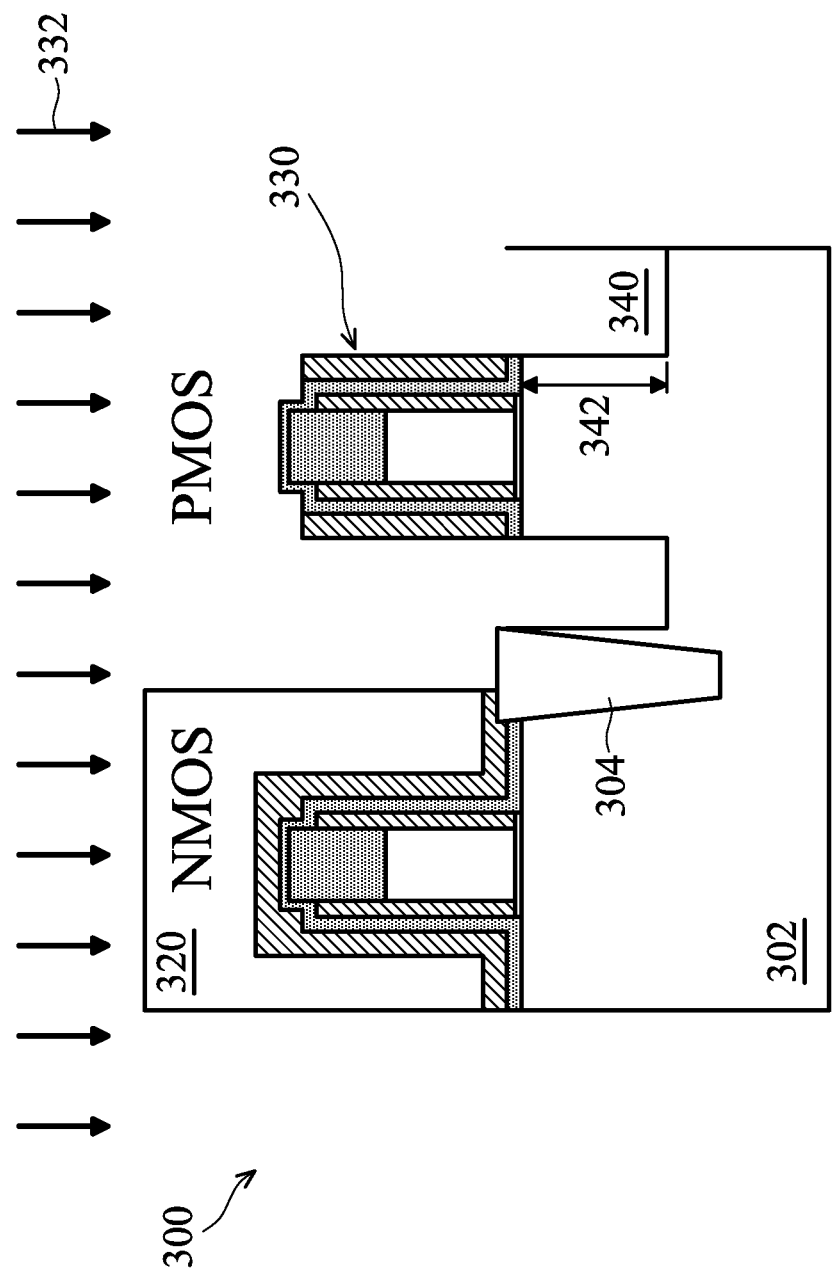

In FIG. 4D, an etching process 332 is performed to etch a recess 340 in the substrate 302. The etching process 332 includes a dry etching process that utilizes a combination of $HBr/Cl_2/O_2/He$, a pressure ranging from about 1 mT to about 1000 mT, a power ranging from about 50 W to about 1000 W, a bias voltage ranging from about 100 V to about 500 V, an HBr flow rate ranging from about 10 sccm to about 500 sccm, a Cl2 flow rate ranging from about 0 sccm to about 500 sccm, an O2 flow rate ranging from about 0 sccm to about 100 sccm, and an He flow rate ranging from about 0 sccm to about 1000 sccm. The dry etching removes portions of the silicon substrate 302 that are unprotected or exposed. Accordingly, the recess 340 has vertical sidewalls that are aligned with the spacers 330 due to the directional/anisotropic etching. The recess 340 may have a depth 342 ranging from about 400 to about 800 Angstrom (Å).

Figure 4E:
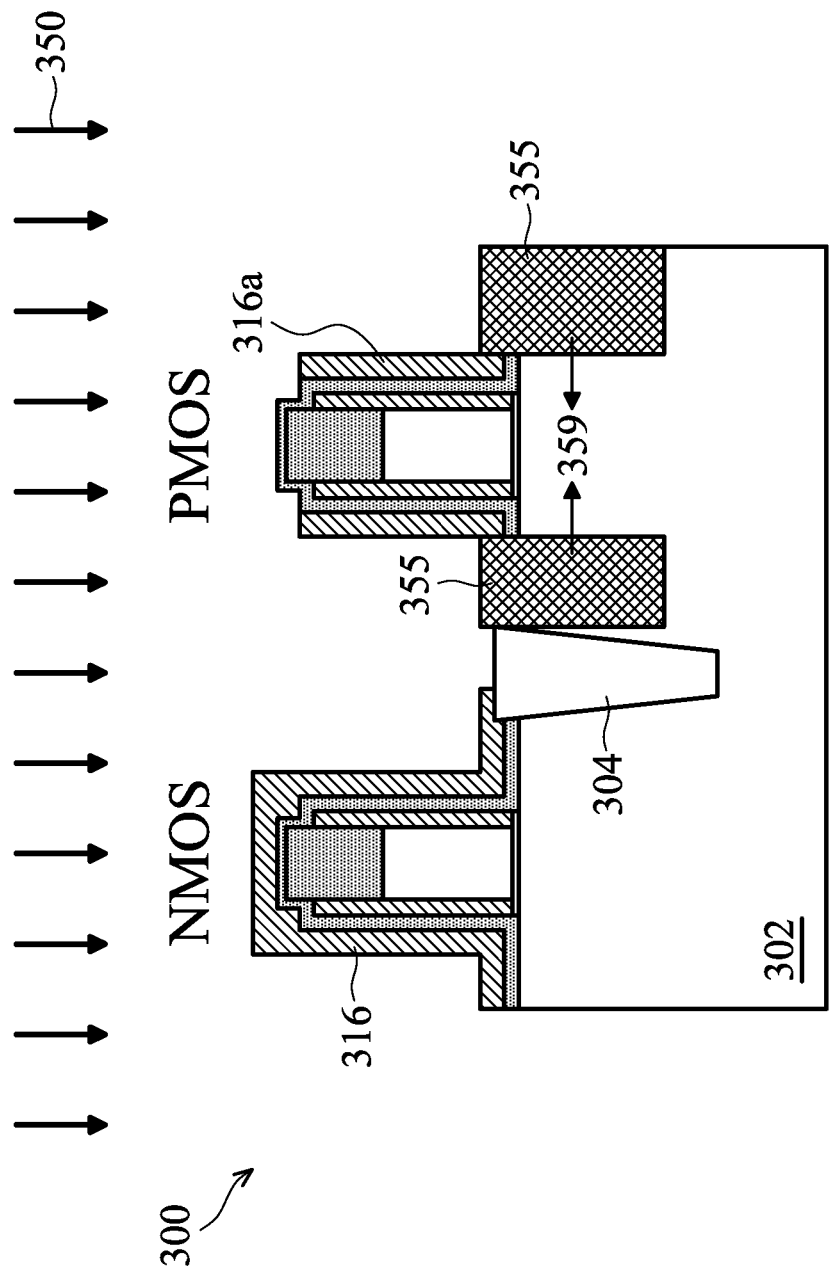

In FIG. 4E, an epitaxy (epi) process 350 is performed to deposit a semiconductor material in the recess 340. The patterned photoresist 320 protecting the NMOS devices is removed prior to the epi process 350. A pre-cleaning process may be performed to clean the recess 340 with HF or other suitable solution. In the present embodiment, the epi process 350 is similar to the bottom-up growth process 110 discussed with reference to FIGS. 2A-2C. Accordingly, a pure Ge crystal structure 355 is grown in the recess 340 to form strained source and drain features. It is noted that there may be some dislocation defects that are trapped at a bottom portion 357 of the Ge structure 355, however these defects should not adversely impact the performance of the PMOS device. Additionally, in some embodiments, the Ge 355 is deposited such that it is raised a distance above the surface of the substrate 302.

As previously discussed, current SiGe structures that are implemented for strained source and drain features are limited as to the amount of strain that can be generated. The concentration of Ge in the SiGe structure determines the amount of strain generated, and thus increasing the Ge concentration will increase the amount of strain. However, the Ge concentration can only be increased up to a certain level so as to achieve a sufficient critical thickness for the strained SiGe structure. Here, in the present embodiment, defect-free pure Ge crystal is formed for the strained source and drain features or high mobility channel. As such, the Ge crystal 355 will generate a significant amount of compressive strain (e.g., about 4 GPa or more) 359 to enhance hole mobility and improve PMOS device performance on Si or SiGe substrate. Thus, other types of stressors such as contact etch stop layer (CESL) will no longer be needed since the Ge source and drain by itself will provide more than 4 GPa compressive channel strain to achieve a maximum Si hole mobility. In furtherance of the present embodiment, the Ge 250 may be in-situ doped with p-type impurities, such as B or In, to form source and drain regions of the PMOS device.

Figure 4F:
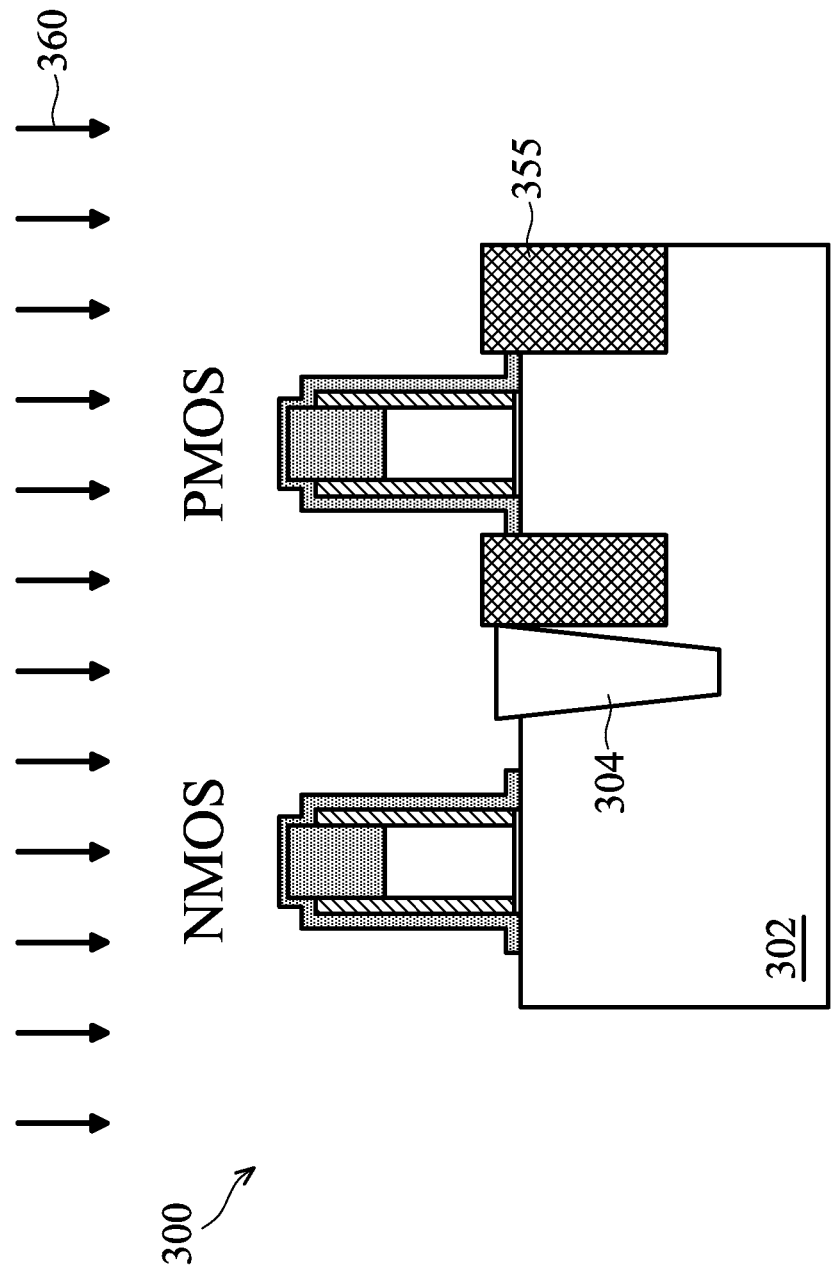

In FIG. 4F, an etching process 360 is performed to remove the nitride layer 316 overlying the NMOS device and nitride layer 316a overlying the PMOS device. The etching process 360 includes a wet etching utilizing H3PO4 or other suitable etchant. The wet etching is selected so that a slow etch rate is achieved to protect the poly. The semiconductor device 300 continues with processing to complete fabrication as discussed briefly below. For example, source/drain regions for the NMOS device may be formed by ion implantation of n-type dopants such as P or As. In another embodiment, silicon carbide (SiC) may be deposited in the silicon substrate trench to form the source/drain regions of the NMOS device by the bottom-up growth technique as described above. Additionally, silicide features are formed on the raised source/drain features to reduce the contact resistance. The silicide can be formed on the sources/drains by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the substrate to polish the substrate. In an embodiment, the gate electrode 308 remains poly in the final device. In another embodiment, the poly is removed and replaced with a metal in a gate last or gate replacement process. In a gate last process, the CMP process on the ILD layer is continued until the poly surface is exposed, and an etching process is performed to remove the poly thereby forming trenches. The trenches are filled with a proper work function metal (e.g., p-type work function metal and n-type work function metal) in the PMOS devices and the NMOS device. A multilayer interconnection (MLI) is formed on the substrate to electrically connect various device features to form a integrated circuit. The multilayer interconnection includes vertical interconnects, such as conventional vias or contacts, and horizontal interconnects, such as metal lines. The various interconnection features may implement various conductive materials including copper, tungsten and silicide. In one example, a damascene process is used to form copper multilayer interconnection structure.

Figure 5A:
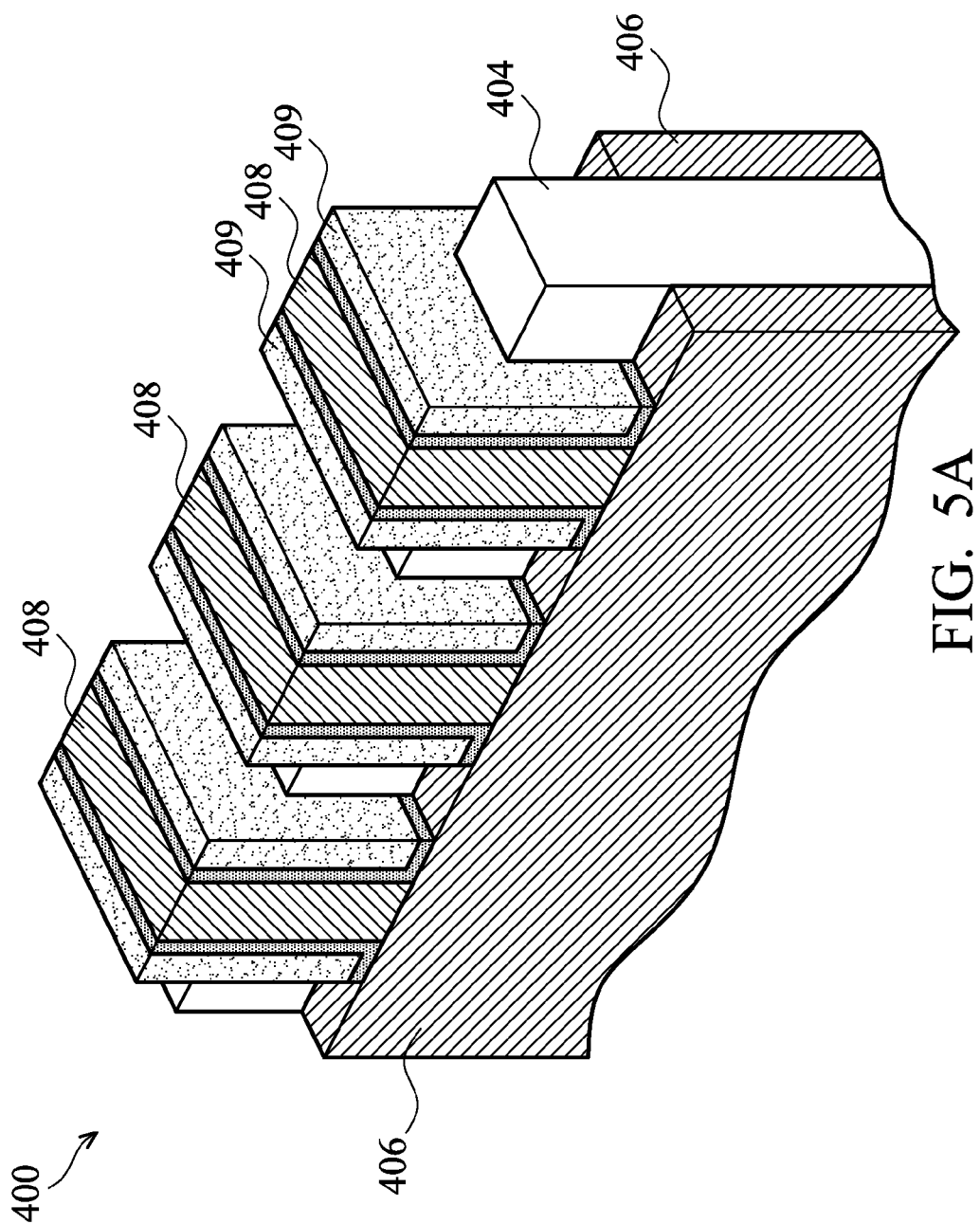
FIGS. 5A-5D are perspective views of another embodiment of a semiconductor device at various stages of fabrication.

Referring to FIGS. 5A-5D, illustrated is another embodiment of a semiconductor device 400 at various stages of fabrication according to various aspects of the present disclosure. The semiconductor device 400 includes a FinFET element. It is understood that FIGS. 5A-5D have been simplified to better understand the inventive concepts of the present embodiment, and thus some known features and processes have been omitted. In FIG. 5A, the semiconductor device 400 includes a substrate (not shown). The substrate may be silicon in a crystalline structure. The semiconductor device 400 includes a plurality of fins 404 that extend from the substrate. Although only one fin is shown, it is understood that the number of fins may vary depending on the particular application. The fins 404 include silicon. The fins 404 may be fabricated by using suitable process such as photolithography and etch. For example, the photolithography process may include forming a photoresist layer (resist) overlying the substrate (e.g., on a silicon layer), exposing the resist to a pattern, performing post-exposure bake processes, and developing the resist to form a masking element including the resist. The masking element may then be used to etch fins 404 from the substrate. The fins 404 may be etched using reactive ion etch (RIE) and/or other suitable processes. Shallow trench isolation (STI) structures 406 surround the fins 404 and isolate each fin from the other fins. The STI structures 406 may include any suitable insulating material.

In other embodiments, the substrate includes a silicon-on-insulator (SOI) substrate. The SOI substrate may be fabricated using separation by implantation of oxygen (SIMOX), wafer bonding, and/or other suitable methods. The layer of silicon may be a silicon layer of an SOI substrate (e.g., overlying an insulator layer). The fins may be formed, for example, by etching a layer of silicon on the substrate.

The semiconductor device 400 includes multiple gate structures 408 that are formed over a portion of the fins 404. The gate structures wrap around the fins 404 allowing gate control of the channel from both sides of the fin. The gate structurs 408 include a gate dielectric layer, a gate electrode, and a hard mask similar to the ones discussed with reference to FIG. 4. Spacers 409 are formed on sidewalls of the gate structured 408.

Figure 5B:
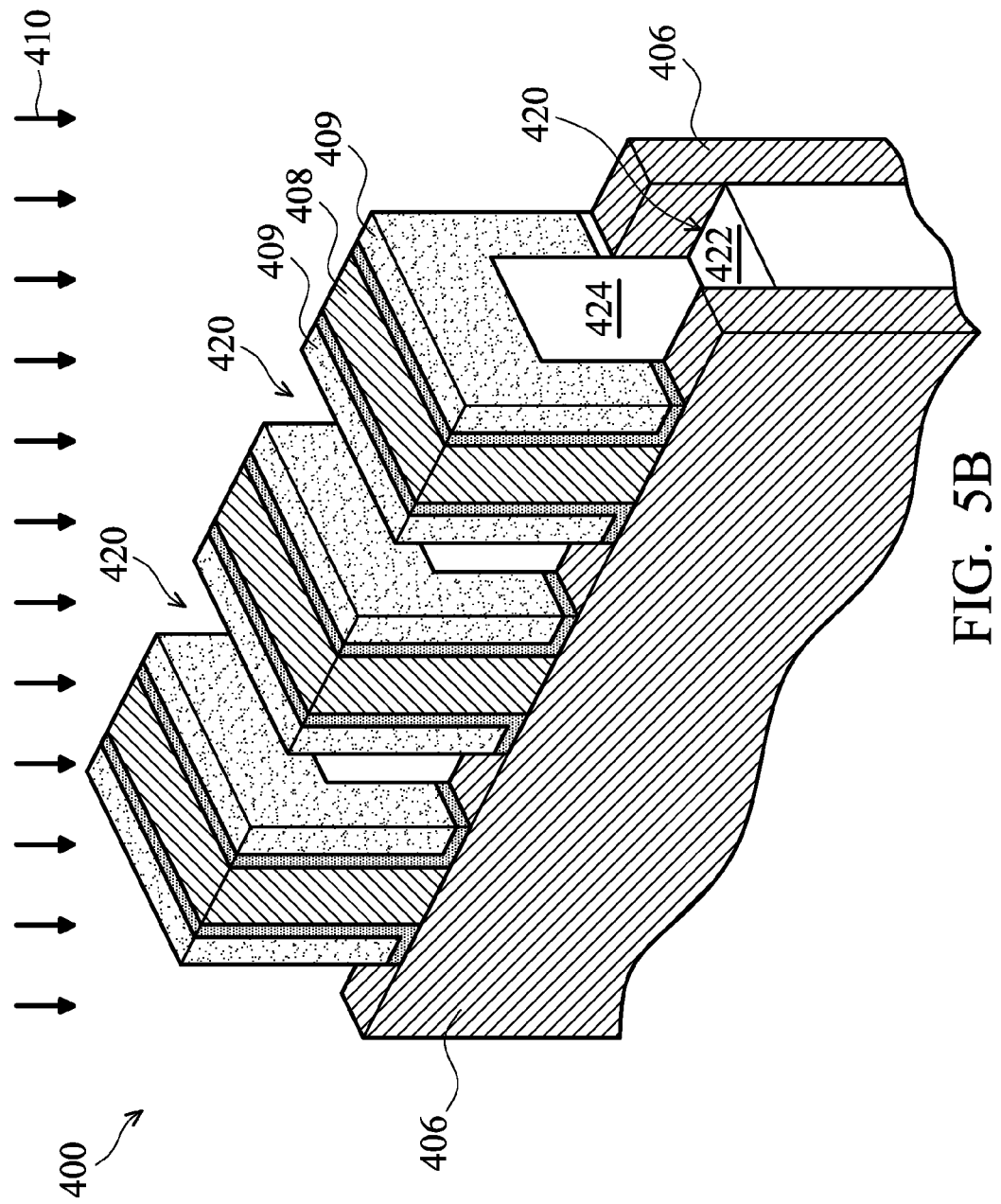

In FIG. 5B, an etching process 410 is performed remove exposed portions of the fins 404. In the present embodiment, the etching process 410 is similar to the etching process 332 of FIG. 4. Therefore, following the etching process 410, a recess 420 is formed. The recess 420 has a bottom surface 422 with a first crystal plane orientation (e.g., [100]) and a side surface 424 with a second crystal plane orientation (e.g., [110]). It is noted that the STI 406 forms the other sides of the recess 420.

Figure 5C:
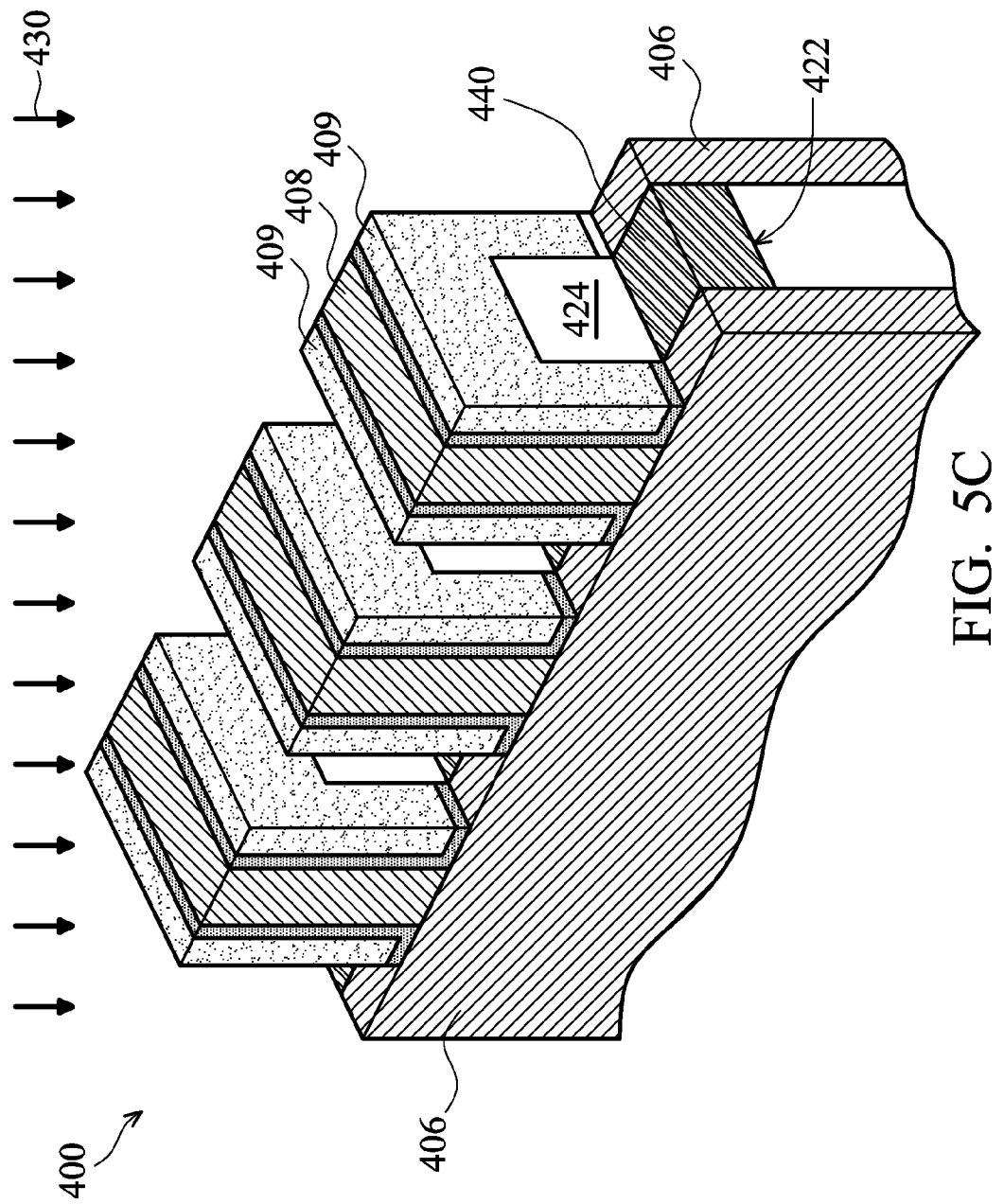
Figure 5D:
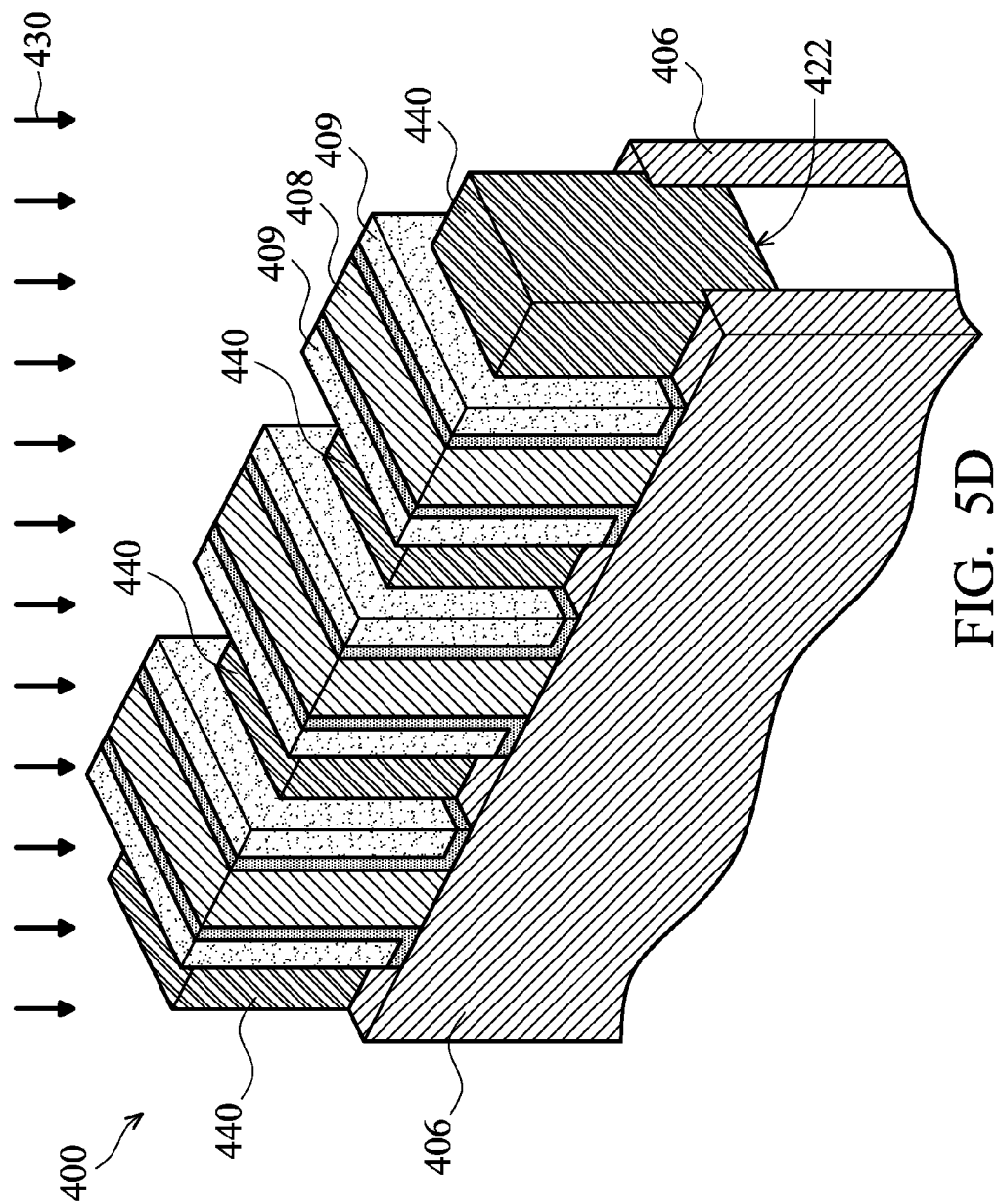

In FIG. 5C, an epitaxial (epi) growth process 430 is performed to deposit a semiconductor material in the recess 420. In the present embodiment, the epi process 430 is similar to the bottom-up growth process 110 discussed with reference to FIGS. 2A-2C. The Ge growth rate on the first crystal plane orientation (bottom surface 422) is greater than the growth rate on the second crystal plane orientation (side surface 424). As discussed above, an etch component controls and prohibits growth on the side surface 424 during the epi process 430. Further, the etch component may remove Ge that may be disposed on the sides of the STI 406. Accordingly, a pure Ge crystal structure 440 is substantially grown in the recess 420 from the bottom-up. The bottom-up growth continues up to the STI 406 surface. In FIG. 5D, the bottom-up growth continues beyond the surface of the STI 406 and is completed to form the Ge structure 440 to a desired height. The Ge structure 440 of the strained source and drain features enhances hole mobility which improves device performance.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, other epi films may be grown in the silicon trench for channel materials such as Ge or III-V compound semiconductors.

What is claimed is:

1. A semiconductor device, comprising:
    a gate structure disposed over a semiconductor substrate;
    a trench in semiconductor material of the semiconductor substrate adjacent the gate structure, wherein a bottom surface of the trench has a first crystal plane orientation of the semiconductor material, and two opposing side surfaces of the trench have a second crystal plane orientation of the semiconductor material, the first crystal plane orientation being different from the second crystal plane orientation; and
    a substantially pure germanium (Ge) epitaxy feature formed within the trench on the substrate and interfacing the bottom surface and the two opposing side surfaces of the trench, wherein the feature is formed of an epi film by a bottom-up growth process prohibiting growth on the two opposing side surfaces by providing an etch component, wherein the resultant epitaxy feature is such that a side surface of the Ge epitaxy is substantially free of dislocation defects, and wherein the resultant epitaxy feature has a crystal plane orientation defined by the bottom surface of the trench including adjacent the two opposing side surfaces; and
    wherein the epitaxy feature provides one of a source and a drain associated with the gate structure.

2. The device of claim 1, wherein the device is a transistor and the Ge epitaxy feature is a source/drain feature.

3. The device of claim 1, wherein the first crystal plane orientation includes [100] and wherein the second crystal plane orientation includes one of [110] and [111].

4. The device of claim 2, wherein the transistor includes a planar FET.

5. The device of claim 1, wherein the semiconductor substrate includes silicon (Si).

6. The device of claim 1, wherein the Ge epitaxy feature provides at least 4 GPa compressive channel strain.

7. A semiconductor device, comprising:
    a trench in a silicon region of a substrate, wherein a bottom surface of the trench has a first crystal plane orientation of the silicon, and two opposing side surfaces of the trench have a second crystal plane orientation of the silicon, the first crystal plane orientation being different from the second crystal plane orientation; and
    a germanium (Ge) epitaxy feature formed within the trench on the substrate, wherein the feature is formed by an epitaxial process including an etch component that prohibits Ge epitaxy from growing from the second crystal plane orientation, wherein the etch component provides the Ge epitaxy feature a structure of an upper portion substantially defect free and side regions adjacent the opposing side surfaces of the trench being substantially defect free and an orientation defined by the first crystal plane orientation.

8. The device of claim 7, wherein the first crystal plane is [100].

9. The device of claim 7, wherein the second crystal plane is [110].

10. The device of claim 7, wherein the Ge epitaxy feature includes dislocation defects in a bottom portion underlying the upper portion.

11. The device of claim 7, wherein the semiconductor device is a p-type metal oxide semiconductor (PMOS) device.

* * * * *